United States Patent [19]

Bradshaw

[11] 4,374,317
[45] Feb. 15, 1983

[54] BURN-IN CHAMBER

[75] Inventor: James I. Bradshaw, Houston, Tex.

[73] Assignee: Reliability, Inc., Houston, Tex.

[21] Appl. No.: 55,058

[22] Filed: Jul. 5, 1979

[51] Int. Cl.³ .............................................. H05B 1/00
[52] U.S. Cl. ....................................... 219/385; 219/201
[58] Field of Search ................ 219/385, 201; 174/151, 174/67, 59; 339/36, 112; 312/257 SK; 361/382–384

[56] References Cited

U.S. PATENT DOCUMENTS

| | | | |
|---|---|---|---|
| 1,862,811 | 6/1932 | Strong | 174/59 |
| 2,799,523 | 7/1957 | Parker | 286/26 |
| 2,956,106 | 10/1960 | Hasselhorn et al. | 174/59 |
| 3,165,674 | 1/1965 | Swan | 317/101 |
| 3,341,806 | 9/1967 | Joachim | 339/112 |
| 3,408,565 | 10/1968 | Frick et al. | 324/158 |
| 3,412,333 | 11/1961 | Frick et al. | 324/158 |
| 3,508,315 | 4/1970 | Hoffken | 29/203 |
| 3,609,547 | 9/1971 | Slusser | 324/158 F |
| 3,645,545 | 2/1972 | Garnache et al. | 277/72 SR |
| 3,710,479 | 1/1973 | Bernardo et al. | 29/203 B |
| 3,727,284 | 4/1973 | Ragard et al. | 29/203 B |
| 3,842,346 | 10/1974 | Bobbitt | 324/73 R |
| 3,845,234 | 10/1974 | Brenner | 174/67 |
| 3,889,053 | 6/1975 | Lloyd et al. | 178/6 |
| 3,893,232 | 7/1975 | Fletcher et al. | 29/203 B |
| 3,898,561 | 8/1975 | Leighton, Sr. | 324/158 R |
| 3,912,353 | 10/1975 | Kasuya et al. | 339/112 R |
| 4,063,347 | 12/1977 | Woodman, Jr. | 29/564.1 |
| 4,067,794 | 1/1978 | Ganzi et al. | 204/301 |
| 4,070,753 | 1/1978 | Liu | 29/741 |
| 4,088,381 | 5/1978 | Harnett | 339/94 A |
| 4,099,325 | 7/1978 | Baker | 29/741 |
| 4,148,534 | 4/1979 | Veburg | 312/257 SK |
| 4,161,064 | 7/1979 | Woodman, Jr. et al. | 29/741 |
| 4,196,513 | 4/1980 | Harigawe et al. | 29/741 |

FOREIGN PATENT DOCUMENTS 2117554 10/1972 Fed. Rep. of Germany ...... 174/151

OTHER PUBLICATIONS

Brochure, "Cost Effective Burn-In for All Types of Semiconductors," Reliability, Inc., 3/76.
Brochure, Reliability, Inc., (Exhibit E), Undated.
Brochure, Reliability, Inc., (Exhibit A), undated.
Brochure, Reliability, Inc., (Exhibit B), undated.
Brochure, "Criteria IV", Reliability, Inc., Copyright 11/77, (Exhibit C).

Primary Examiner—Bernard Roskoski
Attorney, Agent, or Firm—David A. Rose; Ned L. Conley; Murray Robinson

[57] ABSTRACT

An improved connection assembly for connecting a burn-in component board located within a burn-in chamber to control circuitry located outside the chamber is disclosed. The assembly includes a connecting device for connecting the component board to the control circuitry. The improvement includes an isolation apparatus for isolating the connecting device from the chamber, the isolation apparatus including (i) a cavity extending through at least a portion of the wall of the chamber and defining a cavity base disposed between the inner surface of such wall and the exterior of such chamber and (ii) a cavity cover disposed between the cavity base and the interior of the chamber such that contact between the air of the chamber and the connecting device is substantially reduced and the flow of air between the inside and outside of the chamber adjacent the connector is substantially inhibited.

11 Claims, 10 Drawing Figures

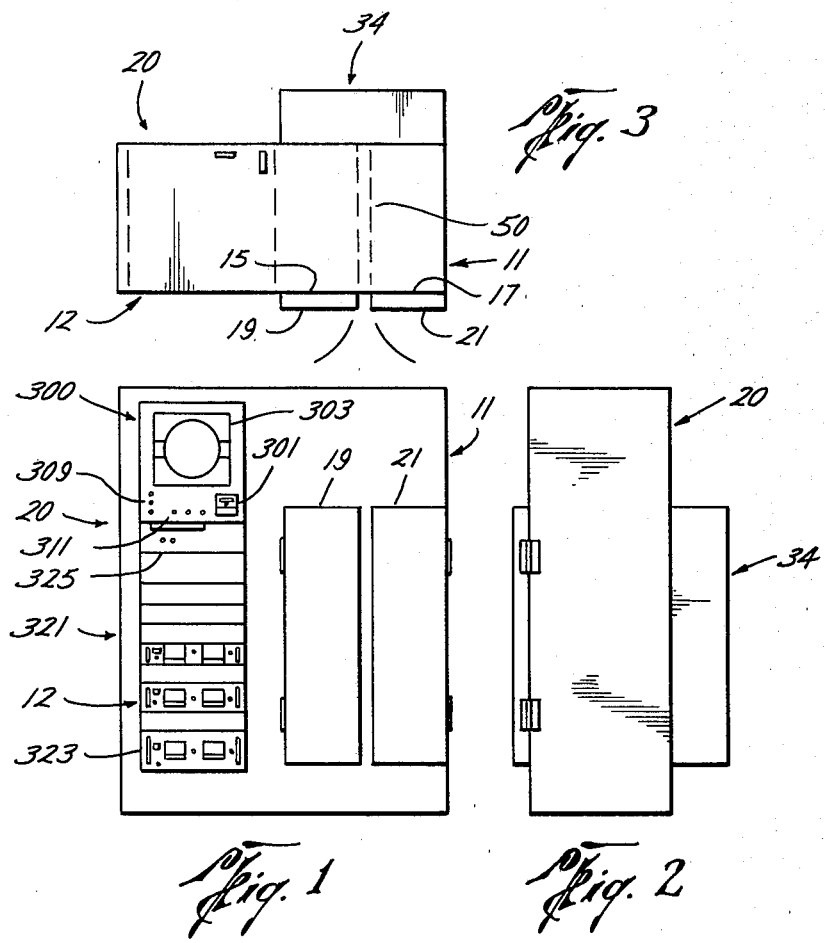
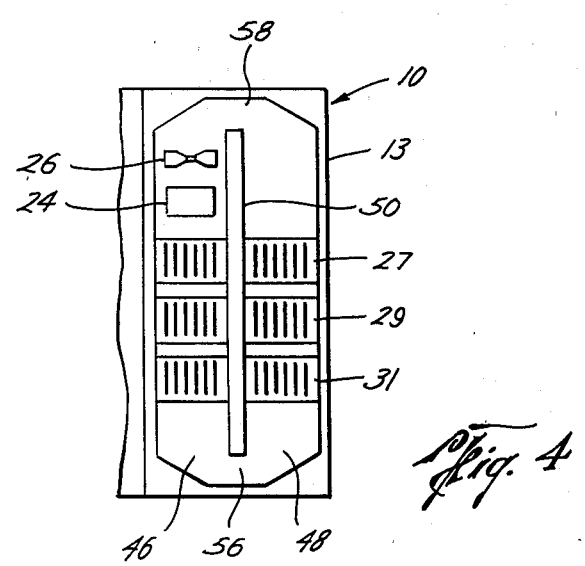

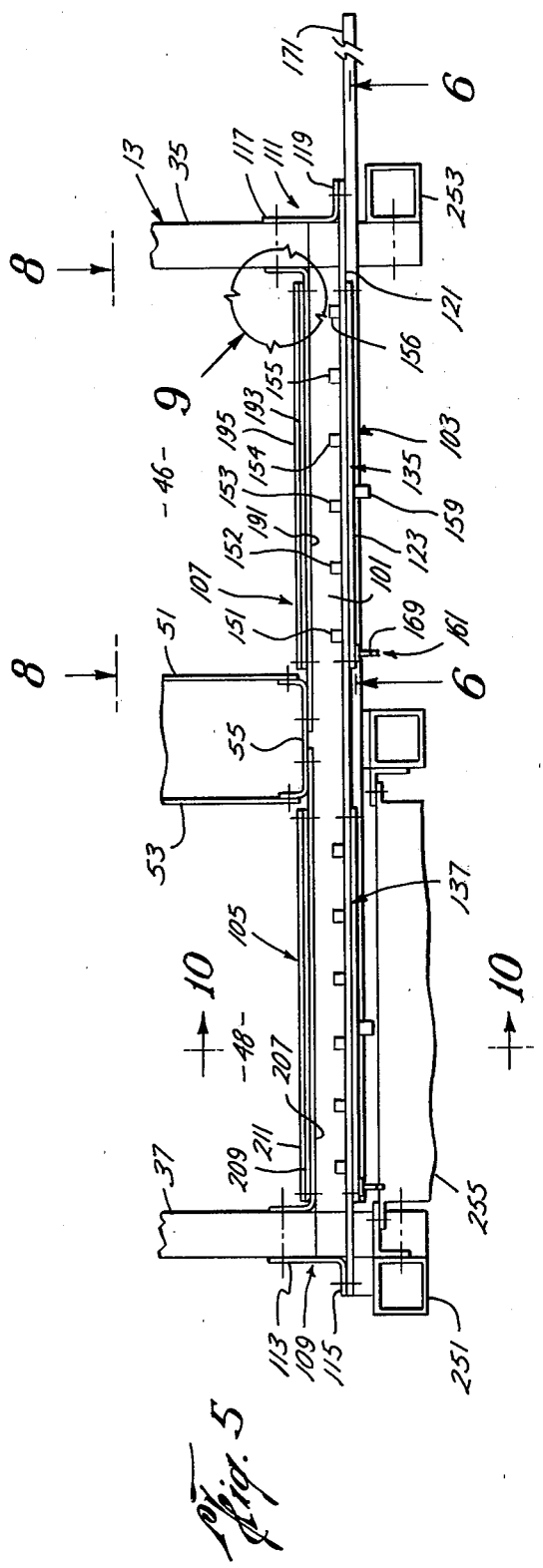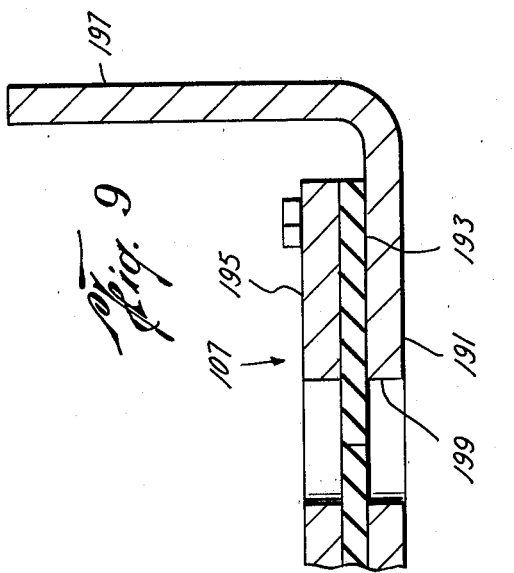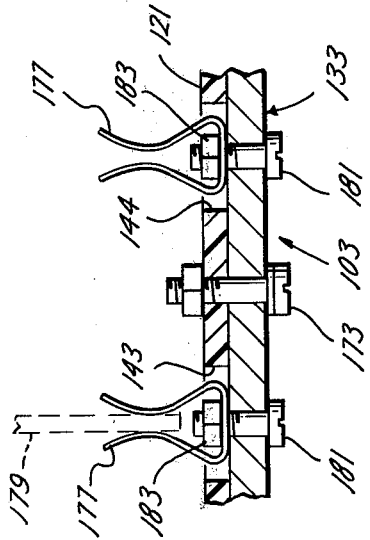

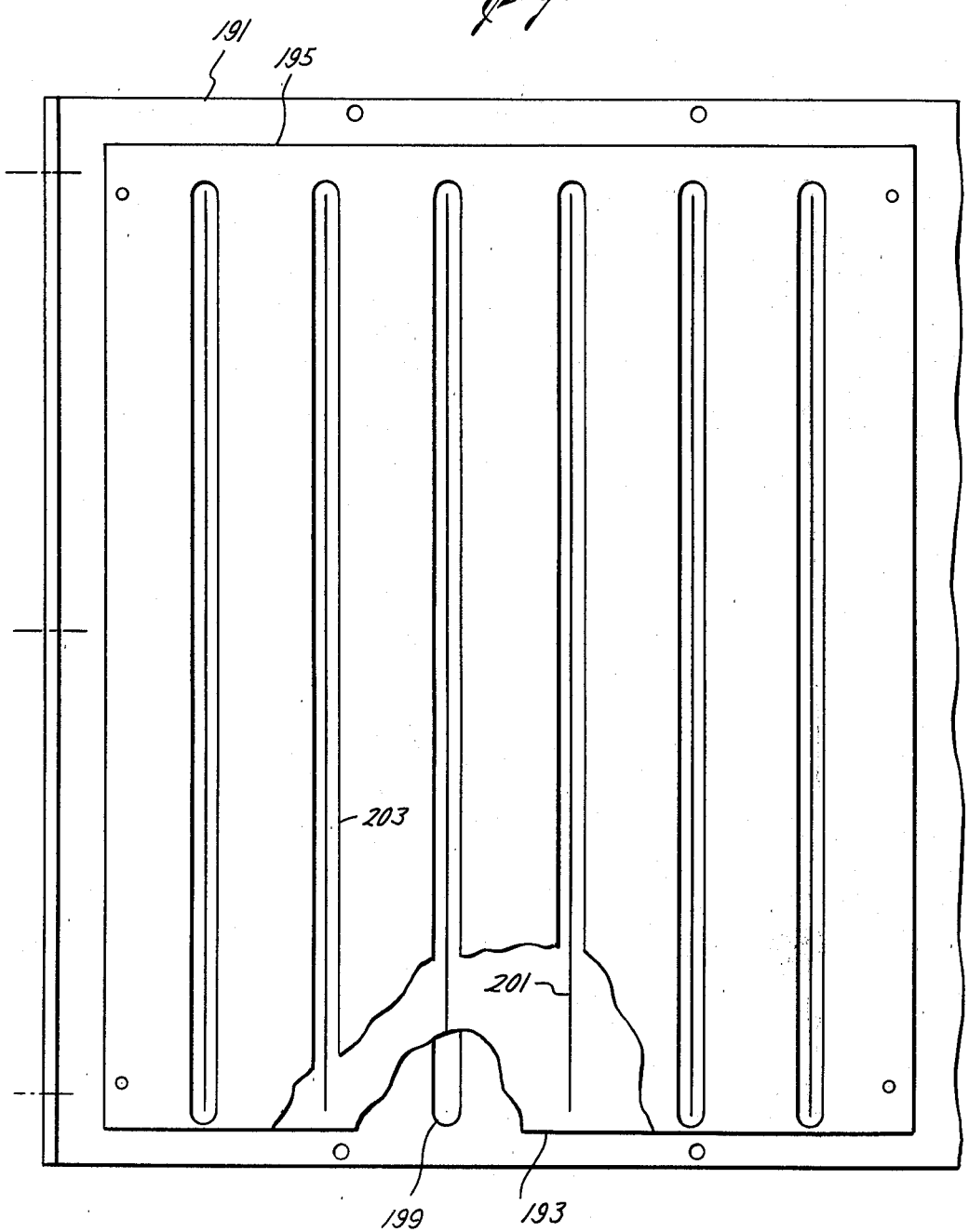

BURN-IN CHAMBER

TECHNICAL FIELD

The present invention related generally to burn-in apparatus for stressing the physical and electrical limits of electronic components under controlled environmental and load conditions, and more particularly to devices for connecting boards holding such components to control circuitry and power supplies.

BACKGROUND ART

One of the most rapidly advancing technologies at the present time, electronics, is centered around semiconductors, particularly integrated circuits. According to present practices, semiconductors are mass-produced and installed in highly-sophisticated, complex and costly equipment. As with many mass-produced products, semiconductors are prone to failure, in many cases within the first few thousand hours of operation. The complexity of the equipment within which such semiconductors are installed makes such post-installation failures highly undesirable. For example, when equipment reaches the final inspection stage of production before semiconductor failures are detected, the high level skills required for testing and repair add a significant cost to production expenses. Even more significantly, when the product is in the field and a service technician must make warranty repairs, the costs incurred can have a marked effect on profitability. As a result, manufacturers of electronic equipment are demanding ever greater quality and dependability in commercial grade semiconductors.

Such quality and dependability is enhanced substantially by detection of those semiconductors likely to fail in the first few hours of operation prior to installation of such semiconductors in electronic equipment. One of the most effective methods of making such a detection is referred to as "burn-in". According to burn-in techniques, semiconductors are stressed within their physical and electrical limits prior to installation whereby those semiconductors likely to become early failures in completed equipment can be uncovered. More particularly, burn-in involves placing a large number of semiconductors on one or more printed circuit boards ("component boards"); placing such component boards with the semiconductors mounted thereon in a chamber whose environment, particularly temperature, is controllable; applying dc biases to each semiconductor on each board in such a manner as to reverse, and sometimes forward, bias as many of such semiconductor's junctions as possible, and/or actively clocking each semiconductor, and/or loading the outputs of each semiconductor to maximum rated conditions, such application of dc biases, clocking signals and loads being accomplished substantially simultaneously to each semiconductor; removing the component boards from the chamber after the semiconductors have been subjected to the environmental condition of the chamber and the biases, clocking signals and loads for a designated period of time; and removing the semiconductors from the component boards. The semiconductors can then be electrically tested by applying a room temperature test of critical dc parameters, e.g. input currents and thresholds, output voltages and currents, and, in the case of digital components, by making a functional test to verify truth table performance. In this way, the semiconductors that fail during burn-in are detected and segregated from those that do not fail. Because the semiconductors that do not fail during the burn-in process have withstood substantial stress, such semiconductors possess a high degree of dependability and can be installed in highly complex equipment with confidence that such semiconductors will not fail prematurely.

During burn-in, it is ordinarily desirable to maintain the environment within the burn-in chamber at an extremely high temperature, often about 150° C., and to maintain the temperature gradient throughout the burn-in chamber at approximately zero. In view of such high temperatures, the chamber is usually saturated with an inert gas, such as $N_2$, in order to minimize I.C. lead tarnish.

Furthermore, because such high temperatures tend to damage and/or to shorten the life of power supplies and circuit components ("clocking components") used in applying dc biases, clocking signals and/or loads to the semiconductors being subjected to burn-in, such power supplies and clocking components ordinarily are positioned outside the chamber.

In the prior art, the power supplies were connected to the component boards by cables extending through the wall of the chamber. The clocking components were mounted on circuit boards ("clocking boards") and each component board was connected to a clocking board by a "through-the-wall" connection. Such through-the-wall connection included a passage through the chamber wall, such passage being covered by a cover plate covering the passage at the inner surface of the chamber wall. The cover plate included two rigid plates having openings therethrough aligned with one another and a rubber gasket having a slit aligned with the plate openings. Each clocking board had a card-edge connector secured thereto and was mounted on the exterior surface of the chamber wall such that the card-edge connector was aligned with the slit of a cover plate. Actual connection of a component board to its corresponding clocking board was made by inserting an edge of the component board through the slit in the gasket and mating such edge with the card-edge connector of the clocking board.

This prior art technique of connecting the component boards to the clocking components and the power supplies has not been satisfactory in that the high-temperature $N_2$-rich gas leaks from the chamber at the points where the power supply cable extends through the chamber wall and where the edge of the component board extends through the gasket. As a result, it is difficult not only to maintain the high $N_2$ concentration but also to maintain the desired temperature gradient of zero since the chamber tends to be cooler adjacent the gasket than in the remainder of the chamber.

DISCLOSURE OF THE INVENTION

The present invention is an improved connection assembly for connecting a burn-in component board located within a burn-in chamber to power supplies and clocking boards located outside the chamber. The configuration of the invention is such that leakage of gas from the interior of the chamber is greatly reduced, the inert gas concentration within the chamber is maintained at a high level and the temperature gradient between the point in the wall of the chamber through which such connection device extends and the remainder of the chamber is significantly reduced.

The connection assembly of the invention includes a connector device for connecting the component board to the power supplies and clocking boards and an isolation apparatus for substantially isolating the connector device from the interior of the chamber, the isolation apparatus including (i) a cavity extending through at least a portion of the wall of the chamber and defining a cavity base disposed between the inner surface of such wall and the exterior of such chamber and (ii) a cavity cover disposed between the cavity base and the interior of the chamber.

BRIEF DESCRIPTION OF THE DRAWINGS

For a detailed description of the preferred embodiments of the invention, reference will now be made to the accompanying drawings wherein FIG. 1 is a front elevation view of an apparatus for performing burn-in;

FIG. 2 is a side elevation view of the burn-in apparatus of FIG. 1;

FIG. 3 is a top view of the burn-in apparatus of FIG. 1;

FIG. 4 is a fragmentary section view of the burn-in apparatus of FIG. 3 taken along line 4—4;

FIG. 5 is a section view taken along line 5—5 of FIG. 4 showing the connection device of the invention;

FIG. 7 is an enlarged fragmentary section view taken along line 7—7 of FIG. 6;

FIG. 8 is a fragmentary front elevation view of the rear wall of the chamber of the burn-in apparatus taken along the line 8—8 in FIG. 5;

FIG. 9 is an enlarged view of inset 9 of FIG. 5; and

BEST MODE FOR CARRYING OUT THE INVENTION

Figure 6:
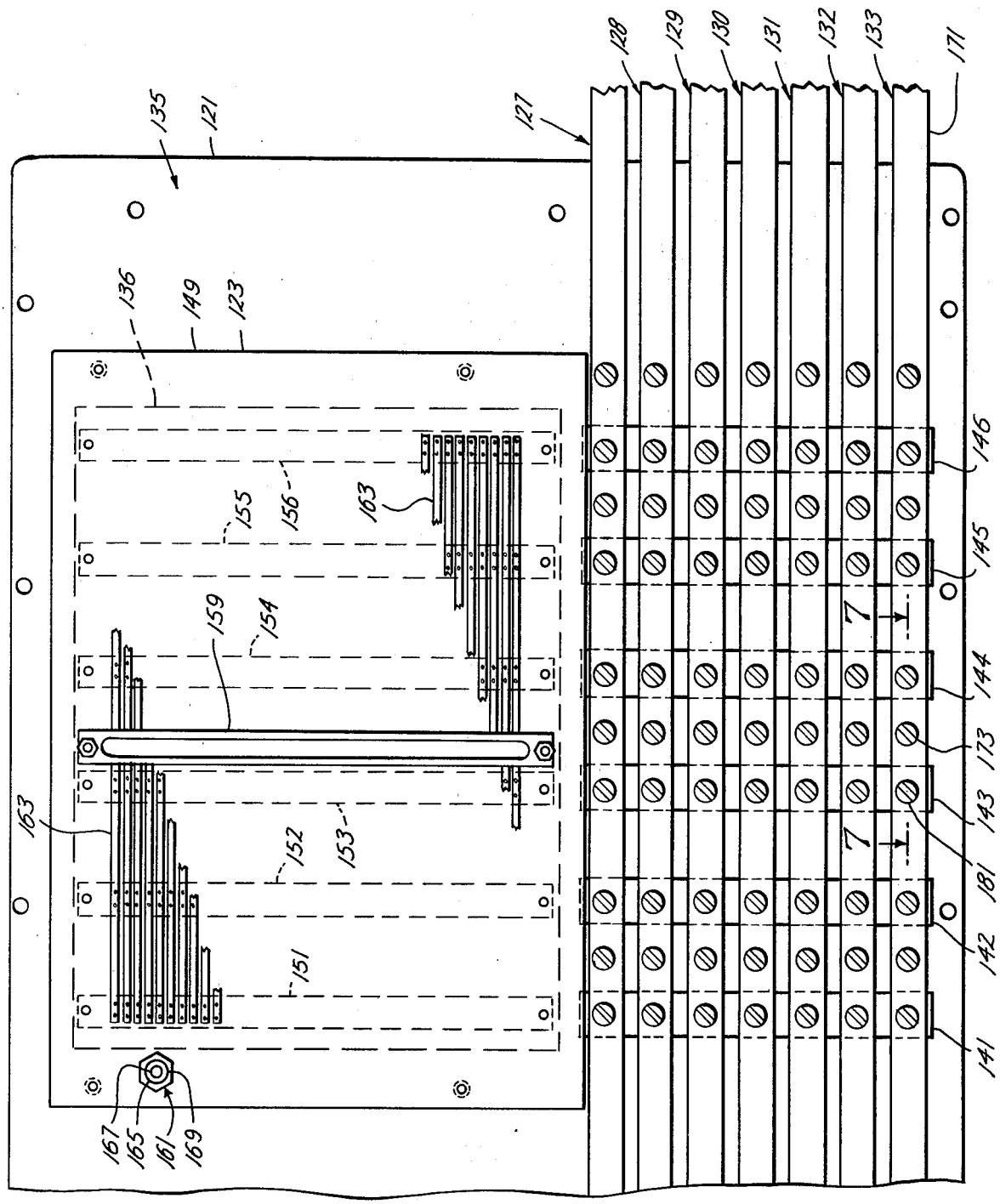
FIG. 6 is a fragmentary section view taken along line 6—6 of FIG. 5.

Referring to FIGS. 1-4, a burn-in apparatus includes cabinet 20 comprising a welded steel frame partially enclosed by steel panels. Cabinet 20 includes instrumentation and power supply portion 12 and chamber portion 11. The burn-in apparatus further includes rear cabinet 34 attached to cabinet 20 directly behind temperature chamber portion 11.

Chamber portion 11 includes chamber 10 generally enclosed on six sides by chamber wall 13. Wall 13 is preferably made of 1 inch thick marinite insulation material. The front portion of wall 13 has access openings 15, 17 for permitting access to the interior of chamber 10. Access openings 15, 17 are covered by doors 19, 21, respectively, such that when doors 19, 21 are closed, chamber 10 is substantially thermally insulated from the ambient outside cabinet 20. Chamber 10 is divided into left and right sections 46, 48, respectively, by mid-chamber wall 50 extending substantially vertically through the center of chamber 10. Wall 50 extends through the entire depth of chamber 10 with the top of wall 50 spaced below the top of chamber 10 so as to form upper duct 58 and the bottom of wall 50 spaced above the bottom of chamber 10 so as to form lower duct 56. As shown in FIG. 5, mid-chamber wall 50 comprises parallel vertical panels 51, 53 connected together adjacent rear portion 33 of chamber wall 13 by bracket 55. Bracket 55 is attached to the interior surface of rear portion 33 of chamber wall 13.

Chamber portion 11 further includes heater 24 for heating the interior of chamber 10 and air mover 26 for circulating air through chamber 10. Preferably, heater 24 comprises eight 600 watt electric-powered heating elements mounted at the top of left section 46 of chamber 10. Such heating elements are replaceable. Air mover 26 includes a cast aluminum impeller mounted in upper duct 58 so as to force air downwardly past heater 24, through left section 46, through lower duct 56, and upwardly through right section 48 of chamber 10. Preferably, air mover 26 should drive the air at a rate of approximately 30 feet per second. Such a velocity of air flow normally will maintain a narrow temperature gradient even in a loaded chamber, i.e., a chamber fully loaded with components undergoing burn-in.

Chamber 10 further includes connection device assemblies 27, 29, 31 attached to and extending through rear portion 33 of chamber wall 13. Assemblies 27, 29, 31 (1) retain component boards in a fixed position within chamber 10 such that they are spaced from one another and from chamber wall 13 and mid-chamber wall 10 and such that air will flow between them; (2) retain one or more clocking boards in a fixed position behind and outside chamber 10; and (3) provide connection apparatus for electrically interconnecting the component boards, the clocking boards and the power supplies, the power supplies being part of instrumentation and power supply portion 12 as described infra. Assemblies 27, 29, 31 are identical to one another and are vertically spaced from one another over the lower approximately two-thirds of chamber 10.

Referring to FIGS. 5-10, which provide various views of an exemplary connection device assembly, each connection device assembly includes cavity 101 extending through rear portion 33 of chamber wall 13 across the entire horizontal width of such portion 33. Cavity 101 is bounded on the rear by cavity base assembly 103, on the front by cavity cover assemblies 105, 107 and bracket 55 of mid-chamber wall 50, and on the sides by side brackets 109, 111.

Side bracket 109 includes (1) side portion 113 attached to the exterior surface of right portion 37 of chamber wall 13 and extending along the entire vertical height and across the entire horizontal depth of cavity 101 and (2) rear portion 115 extending perpendicularly from the rear of side portion 113 away from chamber 10. Side bracket 111 includes (1) side portion 117 attached to the exterior surface of left portion 35 of chamber wall 13 and extending along the entire vertical height and across the entire horizontal depth of cavity 101 and (2) rear portion 119 extending perpendicularly from the rear of side portion 117 away from chamber 10. The rear surfaces of rear portions 115, 119 of side brackets 109, 111 are in the same plane as the exterior surface of rear portion 33 of chamber wall 13.

Figure 10:
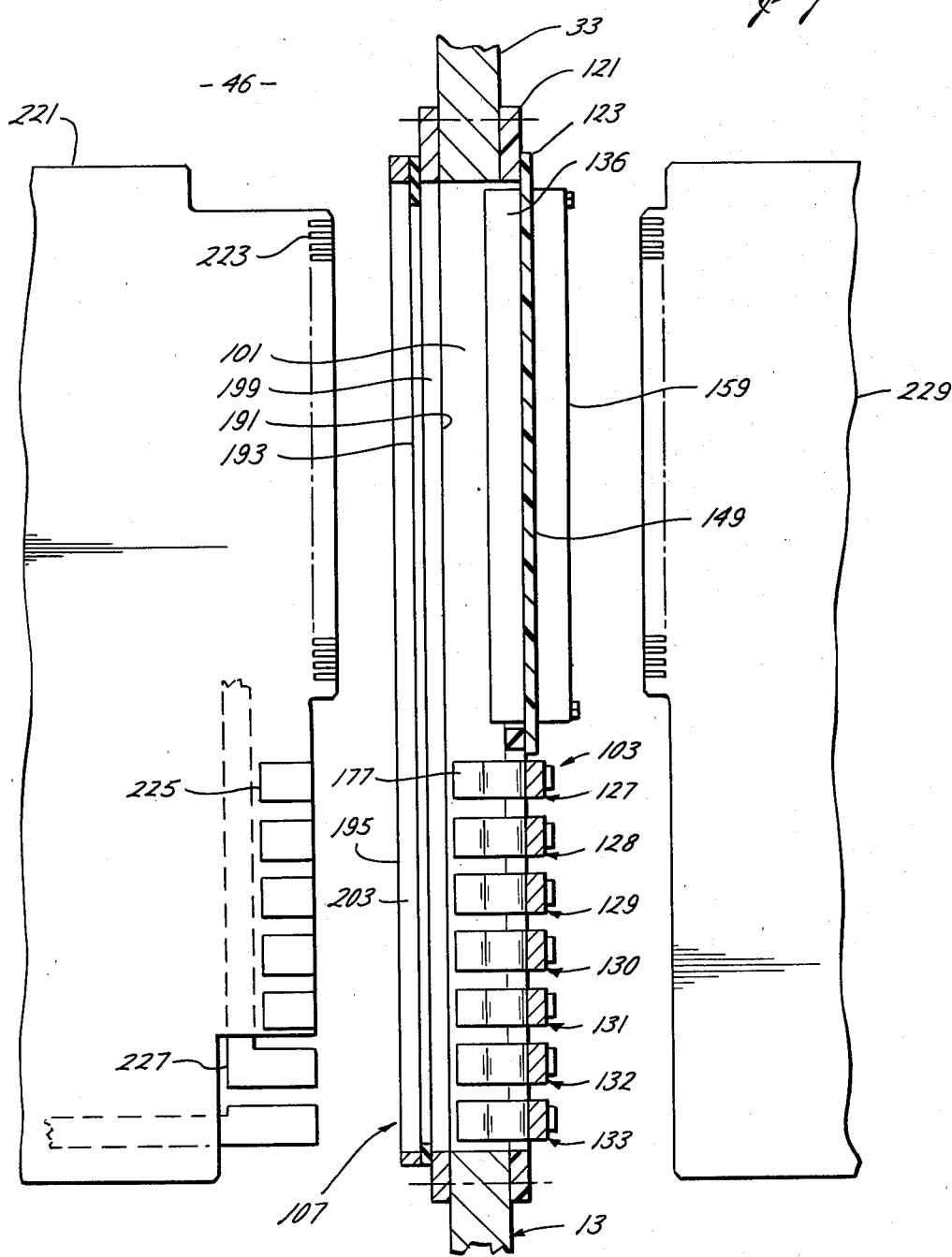
FIG. 10 is a fragmentary section view taken along line 10—10 of FIG. 5 and showing a component and a clocking board immediately before insertion into the component and clocking board connectors, respectively.

Cavity base assembly 103 includes back plane 121, mother board units 123, 125 and bus bar units 127-133. Back plane 121, which is made of a rigid, heat resistant material such as G10 or G11 fiberglass, generally covers the entire rear portion of cavity 101 and is attached to the rear surfaces of rear portions 115, 119 of side brackets 109, 111 on the sides and to the exterior surface of rear portion 33 of chamber wall 13 along the top and bottom. Preferably, a gasket is disposed between back plane 121 on the one hand and side brackets 109, 111 and chamber wall 13 on the other hand. Back plane 121 includes left portion 135 behind left section 46 of chamber 10 and right portion 137 behind right section 48 of chamber 10. Referring to FIGS. 6 and 10, left portion 135 includes rectangular connector access opening 136 substantially centered with respect to left section 46 of chamber 10 extending through the upper approximately one-half of back plane 121 and elongate, vertical power clip access openings 141-146 extending through back plane 121 below connector access opening 136. Openings 141-146 are equally spaced with respect to one another. The width of connector access opening 136 is less than the width of left section 46 of chamber 10 whereby none of power clip access openings 141-146 is positioned behind left portion 35 of chamber wall 13 or mid-chamber wall 50. Right portion 137 of back plane 121 is substantially identical to left portion 135. The connector access opening of right portion 137 is substantially centered with respect to and has a width less than the width of right section 48 of chamber 10 whereby none of the power clip access openings of right portion 137 is positioned behind right portion 37 of chamber wall 13 or mid-chamber wall 50.

Mother board unit 123 includes board 149 made of a rigid, heat resistant material such as G10 fiberglass, and attached to the rear surface of left portion 135 of back plane 121 so as to generally cover connector access opening 136. Mother board unit 123 further includes component board connectors 151-156, clocking board connector 159 and nitrogen nozzle 161 mounted on board 149.

Preferably, connectors 151-156 are printed circuit edge connectors identical to one another and mounted on board 149 such that the board mating portion faces toward the front, but not through, cavity 101 and the connection lugs or terminals extend through board 149 so as to be slightly exposed at the rear surface of board 149. Connectors 151-156 are oriented vertically and are aligned with power clip access openings 141-146, respectively, of back plane 121. Connectors 151-156 are oriented with respect to one another such that the corresponding terminals of such connectors are arranged along a substantially horizontal line. Mother board unit 123 further includes substantially horizontal printed circuit strips 163 etched onto the rear surface of board 149 for interconnecting the corresponding terminals of each of connectors 151-156; i.e., in accordance with conventional terminal assignment for printed circuit edge connectors, for connecting all the A terminals of connectors 151-156 together, for connecting all the B terminals of connectors 156 together, etc. For proper electrical connection, the portion of the terminals or lugs of connectors 151-156 exposed at the rear surface of board 149 are soldered to the corresponding printed circuit strip.

Clocking board connector 159 preferably is a printed circuit edge connector identical to connectors 151-156 and mounted on board 149 such that the board mating portion faces away from the rear surface of board 149, i.e., away from chamber 10 and such that the connection lugs or terminals of connector 159 extend at least partially through board 149. Preferably, connector 159 is oriented vertically and is positioned between component board connectors 153-154 such that the terminals or lugs of connector 159 can be electrically connected to printed circuit strips 163, preferably so that terminal A of connector 159 is connected to the strip corresponding to terminal A of connectors 151-156, terminal B of connector 159 is connected to the strip corresponding to terminal B of connectors 151-156, etc.

In accordance with the above-described configuration of component board connectors 151-156, clocking board connector 159 and printed circuit strips 163, it should be apparent that a signal at terminal A of any one of connectors 151-156 and 159 will be simultaneously applied to terminal A of the remainder of connector 151-156 and 159; a signal at terminal B of any one of connectors 151-156 and 159 will be simultaneously applied to terminal B of the remainder of connectors 151-156 and 159, etc.

Nitrogen nozzle 161 provides a means for supplying nitrogen to cavity 101 and includes body 165 having passage 167 therethrough and tube connecting portion 169 adapted to receive and hold securely a piece of flexible tubing. Tube connecting portion 169 extends from the rear surface of board 149. Body 165 extends through board 149 such that when a nitrogen supply tube is attached to portion 169, nitrogen will flow through passage 167 and into cavity 101.

Mother board unit 127 is substantially identical to unit 125 and is mounted over the connector access opening of right portion 137 of back plane 121 such that the component board connectors of unit 127 are aligned above the respective power clip access openings of right portion 137 of back plane 121.

Each of bus bar units 127-133 includes an elongate bar 171 made of an electrically-conductive material and extending substantially horizontally from a point between the edge of back plane 121 adjacent right portion 37 of chamber wall 13 and the power clip access opening closest to such edge, across back plane 121 and into instrumentation and power supply portion 12 of cabinet 10. Bars 171 of bus bar units 127-133 are vertically spaced from one another with each bar 171 passing over each power clip access opening of back plane 121. Each bar 171 is fastened to back plane 121 by a plurality of machine screws 173 extending through passages in such bar and back plane 121 and secured therein by nut 175.

Each of bus bar units 127-133 further includes a plurality of clips 177 attached to bar 171 of such bus bar unit and extending through a power clip access opening and into cavity 101, there being one clip 177 for each such opening over which such bar 171 passes. Clips 177 are designed to receive a printed circuit board, such as board 179 shown in FIG. 7, such that clip 177 will make an electrical connection with printed circuit lands on either surface of such board. Each clip 177 is connected to a bar 171 by a screw and nut 181, 183, respectively, such that such clip is centered with respect to the power clip access opening through which such clip extends. Each clip 177 should be oriented such that a printed ciruit board can be received simultaneously by such clip and the component board connector positioned directly above the power clip access opening through which such clip extends. Each clip 177 should have a good electrical connection with the bar 171 to which it is attached.

In accordance with the foregoing description of bus bar units 127-133, it should be apparent that for each bar 171, there is a corresponding clip 177 extending into cavity 101 directly below each component board connector. Thus, a printed circuit received by any one of the component board connectors can simultaneously be electrically connected to each of bars 171.

Cavity cover assembly 107 includes rear panel 191, gasket 193 and hold down plate 195. Rear panel 191 generally covers the portion of cavity 101 at the rear of left section 46 of chamber 10 and is attached at one end to bracket 55 of mid-chamber wall 50 and at the other end to the interior surface of left portion 35 of chamber wall 13. Panel 191 includes side flange 197 for facilitating attachment to left portion 35 of chamber wall 13. Rear panel has a plurality of slots 199 therethrough, each slot 199 aligned with a component board connector of mother board 123. Each slot 199 extends vertically from a point spaced above the top of the receptacle of such component board connectors to a point spaced below the lowermost bar 171 of bus bar units 127-133, i.e., bus bar unit 133. Preferably, each slot 199 is 0.50 inch wide.

Gasket 193 is juxtaposed to the front surface of rear panel 191 and completely covers all of slots 199. Gasket 193 includes a plurality of slits 201, each slit 201 aligned with one of slots 199 of rear panel 191 and extending substantially the entire length of such slot 199. Gasket 193 is made of a flexible material, such as 0.125 inch thick silicone rubber, that will permit passage of a printed circuit board through a slit while maintaining a substantial air seal about such board.

Hold down plate 195 secures gasket 193 to rear panel 191 and serves to improve the flexible seal action of gasket 193. Thus, plate 195 has a configuration substantially identical to that of gasket 193 and is oriented so as to generally cover gasket 191. Hold down plate 195 is secured juxtaposed to gasket 193 by screws extending through plate 195, gasket 193 and into rear panel 191. Hold down plate 195 includes a plurality of slots 203 therethrough, each slot 203 having a configuration substantially identical to that of slots 199 and aligned with one of slots 199 so as to expose a slit 201.

Cavity cover assembly 105 is substantially identical to cavity cover assembly 107 and includes rear panel 207, gasket 209 and hold down plate 211. Each slot of panel 207 and hold down plate 211 and each slit of gasket 209 are aligned with one of the component board connectors of mother board 125 and extend from a point above such component board connector to a point below bar 171 of the lowermost bus bar unit. Rear panel 107 generally covers the portion of cavity 101 at the rear of right section 48 of chamber 10 and is connected between the interior surface of right portion 37 of chamber wall 13 and bracket 55 of mid-chamber wall 50.

In accordance with the foregoing description of a connection device assembly, it should be apparent from FIG. 10 that a component board 221 having edge connection lands 223 etched thereon for mating with a card-edge connector, power connection lands 225 etched thereon along the same edge as that containing lands 223, and power connection bars 227 disposed adjacent lands 225 can be mated with a component board connector and with the clips extending through the power clip access opening directly below such component board connector by inserting the edge of board 221 having lands 223, 225 and bars 227 through the slit of gasket 193 or gasket 209 aligned with such component board connector until mating is securely accomplished. As a result, the edge of board 221 having lands 223, 225 and bars 227 will be generally disposed in cavity 101 and the remainder of board 221 will be disposed in chamber 10.

Similarly, a clocking board 229 having edge connection lands 231 can be mated with a clocking board connector merely by inserting such board into such connector. When a clocking card is securely mated in a clocking card connector of a particular mother board, such clocking card will be connected by way of strips 163 to each component board inserted into one of the component board connectors of such mother board.

Furthermore, the gasket of a cavity cover assembly will provide a seal against any substantial flow of air between chamber 10 and the cavity covered by such cavity cover assembly whether or not there are any component boards inserted through any of the slits of such gasket. As a result, such gasket provides a thermal seal between chamber 10 and such cavity and the temperature within such cavity will be less than that within chamber 10. By providing a supply of gaseous nitrogen through the nozzles of a mother board of a connection device assembly, the temperature of the cavity adjacent such mother board will be maintained well below that of chamber 10. Furthermore, the atmosphere of the cavity adjacent such mother board will be largely inert due to the heavy concentration of nitrogen. As a result of such lower temperature and inert atmosphere, deterioration of the component board connectors of such mother board is reduced well below the deterioration that would occur if such component board connectors were located directly within chamber 10.

Rear cabinet 34 covers the exterior surfaces of connection device assemblies 27, 29, 31 as well as the clocking boards mated with the clocking board connectors of such assemblies. Rear cabinet 34 may be secured to frame members 251, 253 of cabinet 10. Preferably, rear cabinet 34 includes doors on its rear surface for permitting access to the clocking boards as well as to the connection device assemblies should repair or adjustment be necessary. Cabinet 34 may further include card trays, such as that referenced as tray 255, attached to the frame of cabinet 10 and extending in a horizontal plane from the exterior surface of rear portion 33 of chamber wall 13 adjacent connection device assemblies 27, 29, 31, such card trays being positioned so as to support the clocking boards mated with the clocking board connectors of such connection device assemblies.

Cabinet 34 may further include a gas manifold having a single inlet port and leaving an outlet port for each mother board of each of connection device assemblies 27, 29, 31. The inlet port is connected by a hose through a regulator to a source of nitrogen gas or other gas such as air, ordinarily stored in the rear of instrumentation and power supply portion of cabinet 10. Each outlet port is connected by a tube to the nozzle of one of the mother boards of connection device assemblies 27, 29, 31. Thus, when the gas is supplied by the source of such gas through the regulator to the gas manifold, such gas will flow into the cavity of each of connection device assemblies 27, 29, 31 adjacent the component board connectors of such assemblies.

Instrumentation and power supply portion 12 of cabinet 10 includes rack mounted equipment for controlling the environment within chamber 10 and for supplying and controlling the supply of electrical power to both the clocking boards and the component boards. As indicated supra, instrumentation and power supply portion may further include a source of nitrogen gas, generally in the form of a tank with a regulator mounted thereon.

The rack mounted equipment preferably includes an environmental control unit 300 having temperature controller 301 for controlling the supply of power to heater 24 (a West Instruments Special 400 Series temperature controller has been found especially suitable for this purpose); temperature recorder 303 for recording the temperature within chamber 10 with respect to time (a Partlow Model RFS recorder having a range of 40° C. to 220° C. and a time period of one week has been found especially suitable for this purpose); an oven temperature control microswitch activated by the temperature sensor of the recorder for shutting heater 26 off when the temperature in chamber 10 exceeds a predetermined level; an air flow switch for minitoring air flow within chamber 10 and shutting heater 26 off ("lockout") when air flow rate falls below a predetermined level; indicators 309 for indicating the status of the apparatus, e.g., standby (ready to begin a burn-in run), running (burn-in run in process) and lockout; control switches 311 for starting and stopping a run and for varying the speed of the impeller of air mover 26; and a power disconnect for breaking the supply of electrical power to the apparatus when current pull becomes excessive (a 3-phase, 30 amp. per lug circuit breaker has been found suitable for this purpose).

The rack mounted equipment further includes power supply unit 321 including power supplies 323 for supplying dc power to the component boards and clocking boards, preferably having the capability of supplying power at several different voltage levels. The outputs of power supplies 323 are connected to bars 171 of bus bar units 127–133, the actual voltage supplied to each bar varying in accordance with the configuration of the component boards and clocking boards being used. Power supply unit 321 may further include power supply sequences 325 for controlling the sequence and time that particular dc voltage levels are supplied by power supplies 323.

The supply of ac power to both environmental control unit 300 and power supply unit 321 may be controlled through a set of control relays.

Although the apparatus described in detail supra has been found to be most satisfactory and preferred, many variations in structure are possible without departing from the spirit of the invention. Because many varying embodiments fall within the scope of the inventive concept herein disclosed and many modifications may be made to the preferred embodiment herein described in detail in accordance with the descriptive requirements without departing from the invention, the details herein set forth are to be interpreted and understood as illustrative and not in a limiting sense.

I claim:

1. An improved apparatus for stressing semiconductors disposed on a component unit having a component retaining portion and a coupling portion, said apparatus being of the type including (i) a chamber having an air space and a wall surrounding said air space, (ii) environment controlling means for maintaining said air space at a temperature substantially greater than that outside said chamber, and (ii) connection means for providing an electrical connection between the inside of said chamber and the outside of such chamber, said connection means including a connector having coupling means for releasably coupling with said coupling portion of said component unit while said component retaining portion of said component unit is disposed within said air space of such chamber, wherein the improvement comprises:

isolation means for isolating said connector from said air space such that contact between the air of said air space and the connector is substantially reduced and the flow of air between the inside and outside of said chamber adjacent said connector is substantially inhibited, said isolation means including (i) a cavity extending from the inner surface of said wall of such chamber through at least a portion of said wall of said chamber, (ii) a cavity base disposed between the inner surface of said wall and the exterior of said chamber and (iii) a cavity cover disposed between said cavity base and said air space of said chamber, said coupling means of said connector being disposed between said cavity cover and the exterior of said chamber and being spaced away from said cavity cover and means for supplying a cooling medium between said cavity cover and said cavity base.

2. The improved apparatus of claim 1 wherein said isolation means further includes gas supply means for permitting the supply of gas from the exterior of such chamber to the portion of said cavity between said cavity cover and said cavity base.

3. An apparatus for stressing electronic components mounted on a circuit board having (i) a coupling edge by which such board can be releasably coupled with a card-edge connector and (ii) a component portion on which such electronic components are mounted, the apparatus comprising:

a chamber including an enclosed air space and a wall substantially surrounding said air space, said wall having (i) a cavity extending from the inner surface of said wall through at least a portion of said wall and (ii) a cavity base disposed between said cavity and the exterior of said chamber;

environment controlling means for maintaining the temperature of said air space at a value substantially greater than that of the ambient on the outside of said wall of said chamber;

connection means for providing an electrical connection between the inside of said chamber and the outside of said chamber, said connection means including a card-edge connector having a receptacle for releasably receiving at least a first portion of such coupling edge of such circuit board such that when such first portion of such coupling edge is received in said receptable of said card-edge connector, such component portion of such circuit board is disposed within said air space of said chamber, said card-edge connector being disposed in said cavity base such that the receptacle of said edge connector is disposed between the inner surface of said wall and the outside of such chamber; and a cavity cover disposed between the innermost portion of said edge connector and said air space for (i) substantially reducing contact between the environment of such air space and said card-edge connector and (ii) substantially inhibiting the flow of air between the inside and the outside of said chamber adjacent said card-edge connector.

4. The apparatus of claim 3 wherein said cavity base is a rigid plate attached to the exterior surface of said wall.

5. The apparatus of claim 3 wherein said connection means further includes a plurality of bus bars with clips mounted thereon, said clips disposed generally within said cavity and positioned to engage releasably and electrically a second portion of such coupling edge of such circuit board when said first portion of such coupling edge is received in said card-edge connector.

6. The apparatus of claim 3 wherein said cavity base includes (i) a first rigid plate attached to the exterior surface of said wall of said chamber and having a connector passage therethrough and (ii) a second rigid plate attached to the exterior surface of said first rigid plate and completely covering said connector passage, said card-edge connector of said connector means being mounted on said second rigid plate such that said receptacle of said card-edge connector extends through said connector passage.

7. The apparatus of claim 6 wherein said card-edge connector has terminal lugs attached to said receptable, said terminal lugs extending through said second plate to the exterior chamber and said connection means further including a second card-edge connector having a receptacle and terminal lugs, said second card-edge connector being attached to the surface of said second rigid plate facing away from said connector passage such that said receptacle of said second card-edge connector faces away from said connector passage, said terminal lugs of said card-edge connector being electrically connected to said terminal lugs of said second card-edge connector.

8. The apparatus of claim 6 wherein said first rigid plate further includes a clip opening therethrough and said connection means further includes a plurality of bus bars with clips mounted thereon, said bus bars extending along the exterior surface of said first rigid plate such that said clips extend through said clip opening and into said cavity, said clips being aligned with said card-edge connector such that when said first portion of such coupling edge is received in said card-edge connector, said clips releasably and electrically engage a second portion of such coupling edge.

9. The apparatus of claim 8 wherein said isolation means further includes gas inlet means, including a gas passage extending through said second plate, for permitting a cooling gas to be fed into the portion of said cavity between said cavity cover and said cavity base.

10. The apparatus of claim 3 wherein said cavity cover and said cavity base are spaced apart from one another and said isolation means further includes gas supply means for supplying a cooling gas to the portion of said cavity between said cavity cover and the receptacle of said card-edge connector.

11. An apparatus for stressing electronic components comprising:
   a chamber including an air space and a wall substantially surrounding said air space;
   environment controlling means for maintaining the temperature of such air space at an extremely high level;
   connection means for providing an electrical connection between the inside of the chamber and the outside of the chamber, said connection means including a card-edge connector, having a receptacle, disposed in said wall of said chamber such that the receptacle of said card-edge connector faces toward the inside of said chamber;
   a circuit board having a component carrying portion and a mating edge, at least a portion of said mating edge being received in the receptable of said card-edge connector such that said component carrying portion is disposed in said air space of said chamber;
   isolation means for isolating said card-edge connector and said mating edge of said circuit board from said air space such that contact between said air space and said card-edge connector is substantially reduced and the flow of air between the inside and outside of said chamber adjacent said connector is substantially inhibited,
   said isolation means including a cover disposed between said receptacle of said card-edge connector and said air space, said cover including (i) an opening through which said mating edge of said circuit board extends and (ii) sealing means for sealing against said circuit board adjacent said opening,
   said cover being spaced away from said receptacle of said card-edge connector so as to form a connector chamber between said receptacle of said card-edge connector and said cover, said isolation means further including gas inlet means for permitting the passage of cooling gas into said connector chamber.

* * * * *

UNITED STATES PATENT AND TRADEMARK OFFICE
CERTIFICATE OF CORRECTION

PATENT NO. : 4,374,317
DATED : FEBRUARY 15, 1983
INVENTOR(S) : JAMES I. BRADSHAW

It is certified that error appears in the above—identified patent and that said Letters Patent is hereby corrected as shown below:

```
Column 4, line 24; delete "10" and
     insert -- 50 --.
Column 6, line 22; delete "127" and
     insert -- 123 --.
Column 7, line 7; after "Rear panel"
     insert -- 191 --.
Column 9, line 56; change (ii) to -- (iii) --.
```

Signed and Sealed this

Fourteenth Day of June 1983

[SEAL]

Attest:

DONALD J. QUIGG

Attesting Officer

Acting Commissioner of Patents and Trademarks